(12) United States Patent
Kim et al.

(10) Patent No.: US 6,673,721 B1
(45) Date of Patent: Jan. 6, 2004

(54) PROCESS FOR REMOVAL OF PHOTORESIST MASK USED FOR MAKING VIAS IN LOW K CARBON-DOPED SILICON OXIDE DIELECTRIC MATERIAL, AND FOR REMOVAL OF ETCH RESIDUES FROM FORMATION OF VIAS AND REMOVAL OF PHOTORESIST MASK

(75) Inventors: Yong-Bae Kim, Cupertino, CA (US); Philippe Schoenborn, San Mateo, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/898,194

(22) Filed: Jul. 2, 2001

(51) Int. Cl.⁷ .............................................. H01L 21/302
(52) U.S. Cl. ..................................... 438/725; 438/963
(58) Field of Search ................................. 438/706, 710, 438/714, 725, 745, 963

(56) References Cited

U.S. PATENT DOCUMENTS

| | | | |
|---|---|---|---|
| 3,012,861 A | 12/1961 | Ling | 23/223.5 |
| 3,178,392 A | 4/1965 | Kriner | 260/46.5 |
| 3,652,331 A | 3/1972 | Yamazaki | 117/201 |
| 3,832,202 A | 8/1974 | Ritchie | 106/287 |
| 3,920,865 A | 11/1975 | Läufer et al. | 427/220 |
| 4,705,725 A | 11/1987 | Glajch et al. | 428/405 |
| 4,771,328 A | 9/1988 | Malaviya et al. | 357/49 |
| 5,194,333 A | 3/1993 | Ohnaka et al. | 428/405 |
| 5,314,845 A | 5/1994 | Lee et al. | 437/238 |
| 5,364,800 A | 11/1994 | Joyner | 437/28 |
| 5,376,595 A | 12/1994 | Zupancic et al. | 501/12 |
| 5,470,801 A | 11/1995 | Kapoor et al. | 437/238 |
| 5,558,718 A | 9/1996 | Leung | 118/723 E |
| 5,559,367 A | 9/1996 | Cohen et al. | 257/77 |
| 5,580,429 A | 12/1996 | Chan et al. | 204/192.38 |
| 5,628,871 A | 5/1997 | Shinagawa | 438/514 |
| 5,675,187 A | 10/1997 | Numata et al. | 257/758 |
| 5,688,724 A | 11/1997 | Yoon et al. | 437/235 |
| 5,858,879 A | 1/1999 | Chao et al. | 438/725 |
| 5,864,172 A | 1/1999 | Kapoor et al. | 257/634 |
| 5,874,367 A | 2/1999 | Dobson | 438/787 |
| 5,874,745 A | 2/1999 | Kuo | 257/59 |
| 5,882,489 A | 3/1999 | Bersin et al. | 204/192.35 |

(List continued on next page.)

FOREIGN PATENT DOCUMENTS

| | | | | |
|---|---|---|---|---|
| EP | 0 706 216 A2 | 4/1996 | ......... | H01L/23/532 |
| EP | 0 949 663 A2 | 10/1999 | ......... | H01L/21/312 |
| JP | 63003437 | 1/1988 | .......... | H01L/21/90 |
| JP | 2000-267128 | 9/2000 | .......... | G02F/1/136 |
| WO | WO 99/41423 | 8/1999 | | |

OTHER PUBLICATIONS

Bothra, S., et al., "Integration of 0.25 $\mu$m Three and Five Level Interconnect System for High Performance ASIC", *1997 Proceedings Fourteenth International VMIC Conference*, Santa Clara, CA, Jun. 10–12, 1997, pp. 43–48.

Dobson, C.D., et al., "Advanced $SiO_2$ Planarization Using Silane and $H_2O_2$", *Semiconductor International*, Dec. 1994, pp. 85–88.

*Primary Examiner*—Kin-Chan Chen
(74) *Attorney, Agent, or Firm*—John P. Taylor

(57) ABSTRACT

A process for removal of a photoresist mask used to etch openings in low k carbon-doped silicon oxide dielectric material of an integrated circuit structure, and for removing etch residues remaining from either the etching of the openings or removal of the resist mask, while inhibiting damage to the low k dielectric material comprises. The structure is exposed to a reducing plasma to remove a portion of the photoresist mask, and to remove a portion of the residues remaining from formation of the openings in the layer of low k dielectric material. The structure is then exposed to an oxidizing plasma to remove any remaining etch residues from the openings in the layer of low k dielectric material or removal of the resist mask.

14 Claims, 2 Drawing Sheets

U.S. PATENT DOCUMENTS

| | | | |
|---|---|---|---|
| 5,904,154 A | | 5/1999 | Chien et al. .................. 134/1.2 |
| 5,915,203 A | | 6/1999 | Sengupta et al. ............ 438/669 |
| 5,939,241 A | * | 8/1999 | Leu et al. .................... 430/318 |
| 5,939,763 A | | 8/1999 | Hao et al. .................... 257/411 |
| 6,025,263 A | | 2/2000 | Tsai et al. .................... 438/624 |
| 6,028,015 A | | 2/2000 | Wang et al. ................. 438/789 |
| 6,030,901 A | * | 2/2000 | Hopper et al. .......... 204/192.36 |
| 6,037,248 A | | 3/2000 | Ahn ........................... 438/619 |
| 6,043,167 A | | 3/2000 | Lee et al. .................... 438/789 |
| 6,051,073 A | | 4/2000 | Chu et al. .................... 118/723 |
| 6,051,477 A | | 4/2000 | Nam ........................... 438/404 |
| 6,066,574 A | | 5/2000 | You et al. .................... 438/781 |
| 6,114,259 A | * | 9/2000 | Sukharev et al. ........... 438/623 |
| 6,147,012 A | | 11/2000 | Sukharev et al. ........... 438/787 |
| 6,153,524 A | | 11/2000 | Henley et al. ............... 438/691 |
| 6,204,192 B1 | | 3/2001 | Zhao et al. .................. 438/723 |
| 6,232,658 B1 | | 5/2001 | Catabay et al. ............. 257/701 |
| 6,235,453 B1 | * | 5/2001 | You et al. .................... 430/316 |
| 6,281,135 B1 | * | 8/2001 | Han et al. .................... 438/725 |
| 6,281,589 B1 | * | 8/2001 | Nguyen et al. ............. 257/758 |
| 6,316,354 B1 | * | 11/2001 | Hu ............................. 438/624 |
| 6,417,080 B1 | * | 7/2002 | Yokoshima ................. 438/514 |

OTHER PUBLICATIONS

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Los–k Dielectrics: Will Spin–On or CBD Prevail?", *Semiconductor International*, vol. 23, No. 6, Jun., 2000, pp. 108–110, 114, 116, 118, 122, and 124.

Peters, Laura, "Pursuing the Perfect Low–k Dielectric", *Semiconductor International*, vol. 21, No. 10, Sep., 1998, pp. 64–66, 68, 70, 72, and 74.

Koda, Seiichiro, et al., "A Study of Inhibition Effects for Silane Combustion by Additive Gases", *Combustion and Flame*, vol. 73, No. 2, Aug., 1988, pp. 187–194.

Sugahara, Satoshi, et al., "Chemical Vapor Deposition of $CF_3$—Incorporated Silica Films for Interlayer Dielectric Application", 1999 Joint International Meeting, *Electrochemical Society Meeting Abstracts*, vol. 99–2, 1999, Abstract No. 746.

* cited by examiner

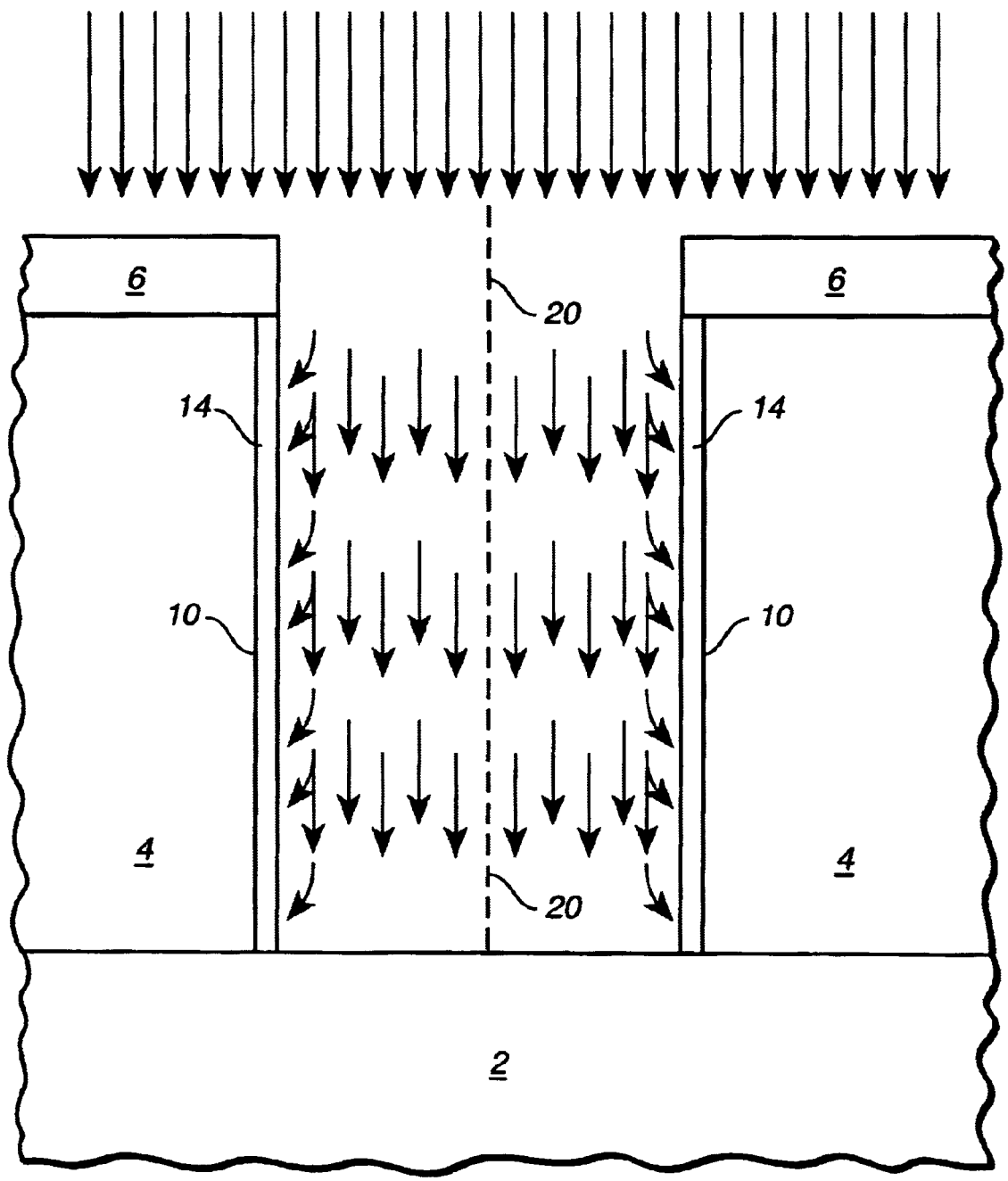
FIG._1

PROVIDING AN INTEGRATED CIRCUIT STRUCTURE HAVING A LAYER OF LOW K CARBON-DOPED SILICON OXIDE DIELECTRIC MATERIAL THEREON WITH VIAS ETCHED THROUGH THE LAYER OF LOW K DIELECTRIC MATERIAL USING A PHOTORESIST MASK OVER THE LAYER OF LOW K DIELECTRIC MATERIAL

EXPOSING THE INTEGRATED CIRCUIT STRUCTURE TO A PLASMA FORMED FROM ONE OR MORE REDUCING AGENTS TO REMOVE AT LEAST SOME OF THE RESIST MASK AND AT LEAST SOME OF THE ETCH RESIDUES

EXPOSING THE INTEGRATED CIRCUIT STRUCTURE TO A DIRECTIONAL BEAM OF CHARGED PARTICLES FROM A PLASMA FORMED FROM ONE OR MORE OXIDIZING AGENTS TO REMOVE ANY REMAINING ETCH RESIDUES FROM BOTH FORMATION OF THE VIAS AND REMOVAL OF THE RESIST MASK

*FIG._2*

PROCESS FOR REMOVAL OF PHOTORESIST MASK USED FOR MAKING VIAS IN LOW K CARBON-DOPED SILICON OXIDE DIELECTRIC MATERIAL, AND FOR REMOVAL OF ETCH RESIDUES FROM FORMATION OF VIAS AND REMOVAL OF PHOTORESIST MASK

CROSS-REFERENCE TO RELATED APPLICATIONS

The subject matter of this application relates to the subject matter of Hu U.S. Pat. No. 6,316,354, issued Nov. 13, 2001 entitled "PROCESS FOR REMOVING RESIST MASK OF INTEGRATED CIRCUIT STRUCTURE WHICH MITIGATES DAMAGE TO UNDERLYING LOW DIELECTRIC CONSTANT SILICON OXIDE DIELECTRIC LAYER", assigned to the assignee of this application, and the subject matter of which is hereby incorporated by reference.

The subject matter of this application also relates to the subject matter of Gu et al. U.S. Pat. No. 6,562,700, issued May 13, 2003, entitled "PROCESS FOR REMOVAL OF RESIST MASK OVER LOW K CARBON-DOPED SILICON OXIDE DIELECTRIC MATERIAL OF AN INTEGRATED CIRCUIT STRUCTURE, AND REMOVAL OF RESIDUES FROM VIA ETCH AND RESIST MASK REMOVAL", assigned to the assignee of this application, and the subject matter of which is hereby incorporated by reference.

BACKGROUND OF THE INVENTION

1. Field of the Invention

This invention relates to a process for an integrated circuit structure having a layer of low k carbon-doped silicon oxide dielectric material. More particularly, this invention relates to the removal of a photoresist mask used to form an opening such as a via or a trench in the low k dielectric material and the removal of residues from both the etching of the opening and the subsequent resist mask removal.

2. Description of the Related Art

In the continuing reduction of scale in integrated circuit structures, both the width of metal interconnects or lines and the horizontal spacing between such metal lines on any particular level of such interconnects have become smaller and smaller. As a result, horizontal capacitance has increased between such conductive elements. This increase in capacitance, together with the vertical capacitance which exists between metal lines on different layers, results in loss of speed and increased cross-talk. As a result, reduction of such capacitance, particularly horizontal capacitance, has received much attention. One proposed approach to solving this problem of high capacitance is to replace the conventional silicon oxide ($SiO_2$) dielectric material, having a dielectric constant (k) of about 4.0, with another dielectric material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of such alternate dielectric materials are disclosed and discussed. Included in these dielectric materials is a description of a low k dielectric material having a dielectric constant of about 3.0 formed using a chemical vapor deposition (CVD) process developed by Trikon Technologies of Newport, Gwent, U.K. The Trikon process is said to react methyl silane ($CH_3$—$SiH_3$) with hydrogen peroxide ($H_2O_2$) to form monosilicic acid which condenses on a cool, wafer and is converted into an amorphous methyl-doped silicon oxide which is annealed at 400° C. to remove moisture.

An article by S. McClatchie et al. entitled "Low Dielectric Constant Oxide Films Deposited Using CVD Techniques", published in the 1998 Proceedings of the Fourth International Dielectrics For ULSI Multilevel Interconnection Conference (Dumic) held on Feb. 16–17, 1998 at Santa Clara, Calif., at pages 311–318, also describes the formation of methyl-doped silicon oxide by the low-k Flowfill process of reacting methyl silane with $H_2O_2$ to achieve a dielectric constant of ~2.9.

The use of low k carbon-doped silicon oxide dielectric material formed by reacting methyl silane with hydrogen peroxide (the Trikon process) has been found to be capable of better gap filling characteristics than other low k materials. Good gap filling characteristics, in turn, can result in the formation of void-free filling of the high aspect ratio space between parallel closely spaced apart metal lines with dielectric material having a lower dielectric constant than that of convention silicon oxide, thereby resulting in a substantial lowering of the horizontal capacitance between such adjacent metal lines on the same metal wiring level.

However, it has been found that the bond formed between the silicon atoms and the organic groups in a carbon-doped silicon oxide dielectric material is not as stable as the silicon-oxygen bond found in conventional silicon oxide ($SiO_2$) materials. For example, unprotected surfaces of such a low k carbon-doped silicon oxide dielectric material may be exposed to oxidizing or "ashing" systems, which are conventionally used to remove a photoresist mask from the layer of low k carbon-doped silicon oxide dielectric material, after formation of openings, such as vias, therein. It has been found that the ashing process results in damage to the bonds (cleavage) between the organic groups and the silicon atoms adjacent the surfaces of the layer of low k carbon-doped silicon oxide dielectric material exposed to such an ashing treatment. This cleavage of the carbon-silicon bonds, in turn, results in removal of such organic materials formerly bonded to the silicon atoms, along with removal of the organic photoresist materials from the integrated circuit structure. The silicon atoms from which the organic groups have been cleaved, and which are left in the damaged surface of low k carbon-doped silicon oxide dielectric material, are in a highly reactive state and become water absorption sites if and when the damaged surface is exposed to moisture.

This absorption of moisture by the damaged low k carbon-doped silicon oxide dielectric material, can result in hydroxyl bonding to the reactive silicon atoms left from the cleavage of the carbon-silicon bonds in the damaged surfaces of the low k carbon-doped silicon oxide dielectric material. This silicon-hydroxyl bond is not a stable bond, and subsequent exposure to heat, e.g., during subsequent processing such as annealing, can result in cleavage of the silicon-hydroxyl bond, thereby causing water vapor formation which, for example, can interfere with subsequent filling of a via/contact opening or a damascene trench with metal filler material, resulting in what is known as via poisoning.

The upper surface of the low k carbon-doped silicon oxide dielectric material can be protected from such attack during removal of the resist mask by provision of a protective layer, e.g. a capping layer of conventional silicon oxide (dielectric constant k of ~4) over the upper surface. However, the use of the conventional ashing (oxidation) process to remove the resist mask causes physical damage to any carbon-doped-silicon oxide material which is exposed in walls of vias, trenches, or contact openings, resulting in cracked, degraded, bowed, and porous insulating material in the walls of such openings. The pores in the walls of vias, trenches, or contact openings can present further problems by retaining destructive gases produced during one or more subsequent metal deposition steps. The physical damage to the insulating material which forms the walls of such openings cause the subsequent metal deposition step to be unreliable; and the presence, in the pore cavities, of gases produced during, metal deposition steps result in a degradation of the metal/metal nitride properties.

Sukharev et al. U.S. Pat. No. 6,114,259, assigned to the assignee of this invention, and the subject matter of which is hereby incorporated by reference, teaches removal of the photoresist mask used to form openings such as vias in low k carbon-doped silicon oxide dielectric material in a two step process. wherein the etched via sidewalls of the low k carbon-doped silicon oxide dielectric material are first treated with a nitrogen plasma, or a nitrogen and oxygen plasma, to densify the exposed low k carbon-doped silicon oxide dielectric material. The photoresist mask is then removed with a mild oxidizing agent comprising an $H_2O$ plasma. The $H_2O$ plasma removes the resist mask without damaging the exposed low k carbon-doped silicon oxide dielectric material comprising the sidewalls of the etched via sufficiently to interfere with later filling of the via with an electrically conductive metal filler.

Wang et al. U.S. Pat. No. 6,028,015, also assigned to the assignee of this invention, and the subject matter of which is also hereby incorporated by reference, teaches treating damaged via sidewalls of low k carbon-doped silicon oxide dielectric material with either a hydrogen plasma or a nitrogen plasma to repair the via sidewall surfaces which have been damaged by prior removal, of the photoresist mask with a traditional ashing/oxidation process, i.e., an oxygen plasma. Such a treatment with a hydrogen or nitrogen plasma is said to cause the hydrogen or nitrogen to bond to silicon atoms with dangling bonds left in the damaged surface of the low dielectric constant carbon-doped silicon oxide insulation layer to replace organo material severed from such silicon atoms at, the damaged surface. Absorption of moisture in the damaged surface of the layer of low dielectric constant carbon-doped silicon oxide dielectric material, by bonding of such silicon with moisture, is thereby inhibited.

Previously cited U.S. Pat. No. 6,316,354 discloses a process for removing resist mask material from a protective barrier layer formed over a layer of low k carbon-doped silicon oxide dielectric material of an integrated circuit structure without damaging the low k dielectric material, and without the necessity of subjecting the exposed via sidewalls of the low k dielectric material to either a pre-treatment to inhibit subsequent damage to the low k dielectric material during the resist removal, or a post treatment to repair damage to the low k material after the resist removal. The resist removal process comprises exposing the resist mask material to a hydrogen plasma formed from a source of hydrogen such as ammonia, while maintaining the temperature below about 40° C. to inhibit attack of the low k silicon oxide dielectric material by oxygen released from the decomposition of the resist material.

Previously cited U.S. Pat. No. 6,562,700, describes a process for removing a photoresist mask used to form openings in an underlying layer of low k carbon-doped silicon oxide dielectric material of an integrated circuit structure formed on a semiconductor substrate, by exposing the photoresist mask in a plasma reactor to a plasma formed using a reducing gas until the photoresist mask is removed. In a preferred embodiment the reducing gas is selected from the group consisting of $NH_3$, $H_2$, and a mixture of $NH_3$ and $H_2$. The low k carbon-doped silicon oxide dielectric material is then treated with a solvent capable of dissolving etch residues left from forming the openings in the low k dielectric material, and from removing the photoresist mask used to form the openings in the low k carbon-doped silicon oxide dielectric material. The low k carbon-doped silicon oxide dielectric material is then annealed in an annealing chamber at a temperature sufficient to remove liquid and gaseous-byproducts from the low k carbon-doped silicon oxide dielectric material.

While the substitution of a milder oxidation process using an $H_2O$ plasma, as proposed by Sukharev et al. U.S. Pat. No. 6,114,259, or the substitution of the reducing processes respectively proposed by Hu U.S. Pat. No. 6,316,354 and Gu et al. U.S. Pat. No. 6,562,700, constitute improvements over the conventional oxidation or ashing process, it has been found that the problem of via poisoning still is experienced at a higher than desirable rate.

Thus, in the processing of low k carbon-doped silicon oxide dielectric material in integrated circuit structures, it remains a goal to provide for the removal of residues from both the via etch step, and removal of the photoresist via mask, in a manner which will not interfere with subsequent filing, with electrically conductive material such as metals, of the vias or other openings in the low k carbon-doped silicon oxide material.

SUMMARY OF THE INVENTION

The invention provides a process for removal of a photoresist mask used to etch openings in a layer of low k carbon-doped silicon oxide dielectric material of an integrated circuit structure, and for removing etch residues remaining from either the etching of the openings or the removal of the resist mask, while inhibiting damage to the low k carbon-doped silicon oxide dielectric material, which comprises: exposing the integrated circuit structure to a plasma formed from one or more reducing agents to remove at least a portion of the photoresist mask, and to remove at least a portion of the residues remaining from formation of the openings in the layer of low k carbon-doped silicon oxide dielectric material. The integrated circuit structure is then exposed to a plasma formed from one or more oxidizing agents to remove any remaining residues from both the formation of the openings in the layer of low k carbon-doped silicon oxide dielectric material and the removal of the resist mask.

In a preferred embodiment, the oxidizing etch is directional using only charged particles and not radicals to provide an anisotropic etching of the openings in the low k carbon-doped silicon oxide dielectric material to thereby inhibit damage to the low k carbon-doped silicon oxide dielectric material comprising the sidewalls of the openings while removing the etch residues.

BRIEF DESCRIPTION OF THE DRAWINGS

FIG. 1 is a fragmentary vertical cross-sectional view of an opening etched in a low k carbon-doped silicon oxide dielectric material and an anisotropic beam of charged particles having an axis parallel to the axis of the opening, passing into the opening during the oxidizing step with stray charged particles intersecting the side walls of the opening to remove the coating formed thereon during the prior reducing step.

FIG. 2 is a flowsheet illustrating the process of the invention.

DETAILED DESCRIPTION OF THE INVENTION

In accordance with the invention, a process is provided for removal of a photoresist mask used to etch openings in a layer of low k carbon-doped silicon oxide dielectric material of an integrated circuit structure, and for removing etch residues remaining from either the etching of the openings or the removal of the resist mask, while inhibiting damage to the low k silicon oxide dielectric material. The process comprises first exposing the integrated circuit structure to a plasma formed from one or more reducing agents to remove at least a portion of the photoresist mask, and to remove at least a portion of the residues remaining from formation of the openings in the layer of low k carbon-doped silicon oxide dielectric material or the residues remaining from removal of the resist mask or the residues remaining from both the formation of the openings in the layer of low k carbon-doped silicon oxide dielectric material and the removal of the resist mask.

Optionally, at this point, the integrated circuit structure may be subject to a wet solvent treatment to remove further etch residues. A example of such a solvent would be an EKC-265 hydroxy amine solvent available from EKC Technology, Inc.

The integrated circuit structure is then exposed to a plasma formed from one or more oxidizing agents to remove any remaining residues from both the formation of the openings in the layer of low k carbon-doped silicon oxide dielectric material and the removal of the resist mask.

Optionally, after this oxidizing plasma step, the integrated circuit structure may again be subject to a wet solvent treatment to remove further etch residues, as described above. It should be emphasized, however, that the use of a wet solvent treatment, either after the reducing plasma step, or after the oxidizing step (or after both plasma steps) is optional, and should only be used as needed.

In a preferred embodiment, the oxidizing etch is directional using only charged particles and not radicals to provide an anisotropic etching of the openings in the low k carbon-doped silicon oxide dielectric material to thereby inhibit damage to the low k carbon-doped silicon oxide dielectric material comprising the sidewalls of the openings.

a. The Low K Carbon-Doped Silicon Oxide Dielectric Material

The term "low k dielectric material", as used herein, is intended to mean a dielectric material having a dielectric constant k which is below 4.0, preferably below 3.5, and most preferably below 3.0.

The low k carbon-doped silicon oxide dielectric material referred to herein comprises the reaction product of an organo-substituted silane and an oxidizing agent. Examples of organo-substituted silanes include the methyl silane referred to in the previously cited Peters and McClatchie et al. articles. The organo-substituted silane may also comprise a multiple carbon-substituted silane such as described in U.S. Pat. No. 6,303,047, issued Oct. 16, 2001, and assigned to the assignee of this invention, the subject matter of which is hereby incorporated by reference. The organo-substituted silane may also comprise an organofluoro silane such as described in U.S. Pat. No. 6,365,528, issued Apr. 2, 2002, and in U.S. Pat. No. 6,572,925, issued Jun. 3, 2003 and Ser. Nos. 09/792,685 and 09/792,691. All of the latter three of the preceding cases were filed on Feb. 23, 2001. All four of these applications are assigned to the assignee of this application, and the subject matter of all four applications is hereby incorporated by reference.

In a preferred embodiment the organo-substituted silane, such as any of those described above, is reacted with a mild oxidizing agent such as hydrogen peroxide to form a low k dielectric material capable of filling high aspect ratio spaces between closely spaced apart structures such as raised lines without creating voids in such spaces.

b. The Reducing Step to Remove Resist Mask and Etch Residues

The reducing agent used in conjunction with the plasma to form a reducing plasma may comprise a gas such. as, for example, ammonia ($NH_3$), hydrogen ($H_2$), or a mixture of either or both gases with nitrogen ($N_2$). As will be discussed below, it is deemed to be preferred that the reducing gas or mixture of gases contain both. hydrogen and nitrogen atoms which will respectively ionize to hydrogen and nitrogen ions. The ratio of nitrogen atoms to hydrogen atoms in the reducing gas or mixture of gases will range from about 2:1 to about 1:2, and preferably from about 1.5:1 to about 1:1.5. The range of the flow of reducing gas or gases into the reactor will be equivalent to a flow of from about 50 standard cubic centimeters per minute (sccm) to about 2000 sccm into a 21 liter reactor.

The plasma power for the reducing plasma may range from about 200 watts to about 1000 watts, with either the substrate and one side of the power supply grounded or a second power supply connected to the substrate to provide a bias on the substrate of from about 500 volts to about 1200 volts. For the reducing plasma, it is preferred to have present both charged particles (ions) as well as uncharged reactive particles (radicals). Therefore, the reducing step should be carried out in equipment capable of generating charged particles (i.e., an RIE beam), but also radicals as well (i.e., a microwave generator). Commercial equipment capable of providing both a supply of uncharged radicals as well as an anisotropic beam of ionized particles is available from ULVAC Technology, Inc. or Novellus Systems, Inc.

The reducing step of the process should be carried out in a reactor at a pressure ranging from about 1 millitorr to about 1 torr while maintaining in the reactor a temperature of from about −20° C. to about 70° C. The reducing step will usually be carried out for a period of time sufficient to remove the desired, amount of residues, usually ranging from about 10 seconds to about 5 minutes.

While we do not wish to be held to any theories of operation of the process, it is thought that the reducing plasma, while reacting with. the resist layer to remove some or all of the resist, may be instrumental in forming an undesired coating of organic nitrogen on the exposed sidewall of the openings in the low k carbon-doped silicon oxide dielectric material, particularly when both nitrogen and hydrogen are present in the: reducing plasma. This sidewall coating is thought to form either by reaction of the reducing plasma with some of the etch residues to form the coating, or by the reducing plasma reacting with the low k carbon-doped silicon oxide dielectric material to form the coating after removing the etch residues. In either case, the exposure of the low k sidewalls of the openings to the reducing plasma apparently results in formation of an organo nitrogen coating on low k sidewalls which may protect the low k dielectric from further attack by the plasma, unlike the conventional oxide ashing procedures used to remove the photoresist mask. However, this coating has ben found to be is unstable and may later interfere with the filling of the opening with electrically conductive material unless it is removed. Formation of this coating is apparently enhanced when both hydrogen and nitrogen are present in the reducing plasma.

c. The Oxidizing Step to Remove Coatings and Etch Residues

On of the key functions of the subsequent oxidizing plasma, therefore, is to remove the coating formed on the sidewalls of the openings in the low k carbon-doped silicon oxide dielectric material during the prior reducing plasma step without, however, damaging the low k carbon-doped silicon oxide dielectric material as it becomes exposed during the removal of the coating formed thereon.

It may be possible to carry out the oxidizing step, including removal of the coating, without damaging the low k carbon-doped silicon oxide dielectric material by careful control of each of the process parameters, and empirically determining the exposure time of the structure to the oxidizing plasma.

However, in a preferred embodiment, the coating is removed from the low k carbon-doped silicon oxide dielectric material in a more controllable and consistent manner by exposing the coating, and the underlying low k carbon-doped silicon oxide dielectric material, as it becomes exposed, to an oxidizing plasma which contains substantially no reactive uncharged particles such as radicals, but rather comprises a directional beam of charged particles which is directed down the central axis of the opening, i.e., parallel to the sidewall surfaces of the opening. In this manner, only a small number of such charged particles stray from the oxidizing beam, but this small number of charged particles has been found to be sufficient, both in flux density and reactivity, to remove the coating over the low k carbon-doped silicon oxide dielectric material, but insufficient to damage the underlying low k carbon-doped silicon oxide dielectric material exposed by this removal of the coating. This treatment of the exposed surfaces of the low k carbon-doped silicon oxide dielectric material with the anisotropic oxidizing plasma may also serve to densify the low k material, thereby making the low k material less porous and more resistant to moisture or other contaminants.

Mitigation of damage to the low k carbon-doped silicon oxide dielectric material is further enhanced by the absence of radicals which, if present, might attack the low k carbon-doped silicon oxide dielectric material as it became exposed by bombardment of the coating by the charged particles. It is further believed that the use of an oxidizing beam of charged particles may serve further to densify the exposed surfaces of the low k carbon-doped silicon oxide dielectric material, particularly during about the first ten seconds of the oxidizing step.

FIG. 1 illustrates the coating removal aspect of the invention, using the anisotropic charged particle only oxidizing plasma. An integrated circuit structure is generally illustrated at 2 having formed thereon a layer 4 of low k carbon-doped silicon oxide dielectric material having an opening 10 such as a via previously etched therethrough. Layer 6 shown formed over low k layer 4 comprises a protective capping layer of dielectric material (e.g., conventional silicon oxide) which protects the upper surface of the low layer. During removal of the photoresist mask and the etch residues by a previous treatment with a reducing plasma, a coating layer 14 forms on the sidewalls of opening 10 which coating layer is to be removed by the directional beam of charged oxidizing particles having its main axis 20 parallel to the sidewalls of opening 10 and coating 14 thereon. It will be noted that while the main flux of particles continues to travel along axis 20 of the beam, stray charged particles stray from the path to intersect and bombard coating 14, resulting in the eventual removal of coating 14 from the sidewalls of opening 10.

The oxidizing plasma, used to remove the residues and the above-discussed coating remaining after exposure to the reducing plasma, may be formed using oxygen gas ($O_2$). or preferably a mixture of oxygen with another gas, such as nitrogen or argon gas. In a particularly preferred embodiment, a mixture of oxygen and argon is used to form the oxidizing plasma. The oxygen/argon ratios may vary from 100 volume percent (vol. %) oxygen and 0 vol. % argon to 5 vol. % oxygen and 95 vol. % argon. Typically, the ratio of oxygen to argon is about 50 vol. % of each gas. The range of the flow of oxidizing gas or gases ($O_2+N_2$ or $O_2+Ar$) into the reactor will be equivalent (for each gas) to a flow of from about 10 standard cubic centimeters (sccm) to about 500 sccm into a 21 liter reactor.

As discussed above, the oxidizing plasma step is preferably carried out using equipment which excludes uncharged radicals, but rather supplies only a beam of charged particles. Commercial equipment capable of providing an anisotropic beam of ionized particles (RIE apparatus) is available from ULVAC Technology, Inc. or Novellus Systems, Inc.

The oxidizing step of the process should be carried out in a reactor at a pressure ranging from about 100 millitorr to about 10 torr while maintaining in the reactor a temperature of from about 10° C. to about 70° C. The oxidizing step will usually be carried out for a period of time sufficient to remove the coating formed on the sidewalls of the openings during the reducing step, as well as any remaining residues, usually ranging from about 10 seconds to about 3 minutes.

d. EXAMPLE

To further illustrate the process of the invention, a number of test substrates were prepared, each having integrated circuit structures previously formed thereon including an intermetallic layer and an insulating layer of low k carbon-doped silicon oxide dielectric material having a number of vias etched therein through a photoresist mask formed over a protective capping layer of oxide on the layer of low k carbon-doped silicon oxide dielectric material.

The substrates were first placed into a 21 liter reactor capable of providing a plasma-containing both uncharged radicals and charged particles. The substrates were subjected to a reducing. plasma to remove the photoresist mask and at least a portion of the etch residues remaining from formation of the vias through the layer of low k carbon-doped silicon oxide dielectric material. Into the reactor was flowed 350 sccm of ammonia, while maintaining the pressure in the reactor at a pressure of about 0.2 torr. The temperature of the substrates in the reactor was maintained at about 30° C. A plasma was ignited in the reactor and held at a power level of about 500 watts for a period of about 3 minutes, after which the plasma was extinguished.

Using the same reactor used above, all of the substrates were then oriented in the reactor so that the substrates were each orthogonal to the particle beam to be generated in the reactor, so that the axis of the charged particle beam would be parallel to the axis of the openings in the substrate. Into the reactor was flowed 100 sccm of $O_2$ and 100 sccm of Ar, while maintaining the reactor at a pressure of about 0.2 torr, and the temperature at about 30° C. While operating the reactor in a RIE mode, an oxidizing plasma was ignited in the reactor and maintained at a power level of about 500 watts for about 30 seconds, after which the plasma was extinguished.

The substrates were then removed from the reactor and some of the substrates were subject to a wet cleaning solvent treatment by immersion of the substrates into an EKC-265 cleaning solution for a period of about 20 minutes to remove further remaining residues: These wet cleaned substrates were then rinsed in DI water and dried.

A thin layer of titanium capable of promoting adherence (a "glue layer") was then deposited by PVD (sputtered) over the surfaces of the etched and cleaned openings in the low k dielectric material on all of the substrates. A CVD barrier layer of titanium nitride was then formed over the titanium layer. The coated or lined openings were then filled with a conductive metal filler material. All of the substrates, having openings in the low k dielectric material thereon cleaned in accordance with the invention, were found to have a reduced number of unfilled or unsatisfactorily filled openings in the layer of low k dielectric material thereon.

Having thus described the invention what is claimed is:

1. A process for removing etch residues from vias and for removing a photoresist mask used to form said vias in low k carbon-doped silicon oxide dielectric material while inhibiting damage to said low k silicon oxide dielectric material which comprises:

a) exposing said photoresist mask and said vias to a plasma formed from one or more reducing agents to remove at least a portion of said resist mask and at least a portion of said etch residues in said vias; and b) then exposing said vias and any remaining portions of said resist mask to a plasma formed from one or more oxidizing agents to remove the remainder of said etch residues in said vias and any remaining portions of said photoresist mask said step of exposing said vias and any remaining portions of said resist mask to a plasma formed from one or more oxidizing agents further comprises exposing said remainder of said etch residues in said vias and any remaining portions of said photoresist mask to a directional beam of charged particles from said plasma formed from one or more oxidizing agents, and said directional beam of charged particles is further characterized by the substantial absence of radicals.

2. The process of claim 1 wherein said one or more reducing agents are selected from the group consisting of ammonia, hydrogen, a mixture of ammonia and hydrogen, a mixture of ammonia and nitrogen, a mixture of hydrogen and nitrogen, and a mixture of ammonia, hydrogen, and nitrogen.

3. The process of claim 1 wherein said one or more reducing agents includes a source of hydrogen and a source of nitrogen.

4. The process of claim 1 wherein said plasma formed from said one or more reducing agents contains radicals and charged particles.

5. The process of claim 1 wherein said one or more oxidizing agents used to form said plasma includes oxygen.

6. The process of claim 1 wherein said one or more oxidizing agents used to form said plasma comprises a combination of oxygen and at least one further gas.

7. The process of claim 1 wherein said one or more oxidizing agents used to form said plasma comprises a combination of oxygen and at least one further gas selected from the group consisting of nitrogen and argon.

8. The process of claim 1 wherein said one or more oxidizing agents used to form said plasma consists essentially of a combination of oxygen and argon.

9. The process of claim 1 wherein said step of exposing said photoresist mask and said vias to a plasma formed from one or more reducing agents further includes forming a coating on the sidewalls of said vias.

10. The process of claim 9 wherein said step of exposing said vias and any remaining portions of said resist mask to a plasma formed from one or more oxidizing agents further includes removing said coating formed on said sidewalls of said vias.

11. The process of claim 1 wherein said step of exposing said photoresist mask and said vias to a plasma formed from one or more reducing agents further includes forming said plasma from one or more reducing agents which includes hydrogen and nitrogens and an organo nitrogen coating forms on the sidewalls of said vias.

12. The process of claim 11 wherein said step of exposing said vias and any remaining portions of said resist mask to a plasma formed from one or more oxidizing agents further includes removing said organo nitrogen coating formed on said sidewalls of said vias.

13. The process of claim 1 which includes the further step of exposing said etch residues from formation of said vias and removal of said photoresist mask to a wet solvent to remove further residues.

14. A process for removing etch residues from vias and for removing a photoresist mask used to form said vias in low k carbon-doped silicon oxide dielectric material while inhibiting damage to said low k silicon oxide dielectric material using a reducing plasma followed by an oxidizing plasma by which comprises:

a) exposing said photoresist mask and said vias to a plasma formed from one or more reducing agents selected from the group consisting of ammonia, hydrogen, a mixture of ammonia and hydrogen, a mixture of ammonia and nitrogen, a mixture of hydrogen and nitrogen, and a mixture of ammonia, hydrogen, and nitrogen, to remove at least a portion of said resist mask and at least at least a portion of said etch residues in said vias; and b) then exposing said vias and any remaining portions of said resist mask to a directional beam of charged particles from a plasma of said one or more oxidizing agents, and further characterized by the substantial absence of uncharged radicals, said one or more oxidizing agents further comprising a combination of oxygen and at least one further gas selected from the group consisting of nitrogen and argon, to remove the remainder of said etch residues in said vias and any remaining portions of said photoresist mask.

* * * * *